(12) United States Patent
Burlingame et al.

(10) Patent No.: US 7,301,379 B1
(45) Date of Patent: Nov. 27, 2007

(54) SYSTEMS AND METHOD FOR A DELAY LOCKED LOOP WITH FALSE-LOCK DETECTION

(75) Inventors: Efram E. Burlingame, San Diego, CA (US); Mikko Waltari, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 189 days.

(21) Appl. No.: 11/194,085

(22) Filed: Jul. 29, 2005

(51) Int. Cl.
*H03L 7/06* (2006.01)

(52) U.S. Cl. .................. 327/158; 327/149; 327/161

(58) Field of Classification Search .................. None
See application file for complete search history.

(56) References Cited

U.S. PATENT DOCUMENTS 5,889,436 A * 3/1999 Yeung et al. .............. 331/2
6,140,880 A * 10/2000 Moyal et al. .............. 331/1 A
6,803,797 B2 * 10/2004 Park ........................ 327/158
2006/0132205 A1 * 6/2006 Wu et al. .................. 327/158

FOREIGN PATENT DOCUMENTS

WO   WO 2005027349 A1 * 3/2005

* cited by examiner

*Primary Examiner*—Cassandra Cox
(74) *Attorney, Agent, or Firm*—Baker & McKenzie LLP

(57) ABSTRACT

A DLL comprises detection circuitry configured to detect a too_slow and a too_fast operating state and correction circuitry configured to correct operation of the DLL when a too_fast or too_slow state is detected. The correction circuitry can be configured to swallow a pulse of the input clock signal when a too_fast condition is detected. The correction circuitry can also be configured to force the DLL into a too_fast operation state, when a too_slow operation state is detected. The correction circuitry can then also be configured to swallow a pulse of the input clock signal once the DLL is in the too_fast operation state.

17 Claims, 7 Drawing Sheets

SYSTEMS AND METHOD FOR A DELAY LOCKED LOOP WITH FALSE-LOCK DETECTION

BACKGROUND

1. Field of the Invention

The present invention relates general to Delay Locked Loops, and more particularly to ways to ensure that a Delay Locked Loop locks to the proper operating state.

2. Background of the Invention

As is well known, Delay Locked Loops (DLLs) are commonly used to generate clock signals that have periods that are sub-multiples of the period of a reference clock signal. A conventional DLL circuit 200, as illustrated, for example, in FIG. 2, comprises a Voltage Controlled Delay Line (VCDL) 202 configured to receive an input clock signal, or reference signal (clk_in). VCDL 202 comprises a plurality of delay blocks 208 configured to delay the input clock signal by a certain amount (TΔ). The delay applied by delay blocks 208 and 210 is controlled via a voltage supply by charge pump 206. It will be understood that VCDL 202 can comprise any number of delay blocks, and that delay blocks 208 and 210 are shown by way of example only.

VCDL 210 produces a clock signal (clk_delay) that is a delayed version of the input clock signal. When DLL 200 is first powered on, the entire circuit must align with, and lock on to, the input clock signal. In order to ensure that this occurs, the delayed clock signal at the output of VCDL 202 is fed to a Phase-Frequency Detector (PFD) 204. In addition, the input clock signal is fed to another input of PFD 204. PFD 204 can be configured to compare the phase of the delayed clock signal with that of the input clock signal and determine whether the delays applied by blocks 208 and 210 should be increased or decreased in order to align the phase of the delayed clock signal with that of the input clock signal.

PFD 204 controls the delays of blocks 208 and 210 by controlling the voltage output by charge pump 206. PFD 204 does this via an up output and a down output that control the voltage produced by charge pump 206. If the delayed clock signal is too slow, then PFD 204 can send up commands to charge pump 206, which will cause charge pump 206 to increase the voltage supplied to delay blocks 208 and 210. Increasing the voltage supplied to delay blocks 208 and 210 will cause the delay (TΔ) to decrease, which should bring the delayed clock signal back into phase with the input clock signal.

Conversely, if the delayed clock signal is too fast, then PFD 204 can send down commands to charge pump 206 which will cause the voltage supply to delay caps 208 and 210 to decrease. Decreasing the voltage supply to delay caps 208 and 210 should increase the delay (TΔ) applied to the input clock signal and should bring the delayed clock signal back into phase with the input clock signal.

FIG. 1 is a timing diagram illustrating waveforms for the various clock signals in DLL 200. As can be seen, the input clock signal (clk_in) has a period (T). The output clock signal (clk_out) can for example be configured to have half the period (T/2), i.e., be twice as fast, as the input clock signal. In the example illustrated in FIG. 1, the delayed clock signal (clk_delay) is delayed by one clock period (T).

When DLL 200 is first powered up, it is possible that it will correctly lock onto the input clock signal; however, there are other possible stable operating points that would produce incorrect results. For example, DLL 200 has no way to know if the delayed clock signal is delayed by exactly one period (T) or if in fact it is delayed by two periods (2 T) or more. When the delayed clock signal is delayed by a multiple of more than one times the input clock period (T), this can be referred to as a too_slow operating condition. In addition, the delayed clock signal can actually be trying to lock to a zero delay state, which is an impossible state. When this occurs, DLL 200 can be set to be operating in a too_fast operating condition.

When DLL 200 is operating in a too_fast or too_slow condition, it can be said to be in a false-lock state. Thus, conventional DLL circuits can suffer from an inability to detect too_fast and too_slow operating conditions, i.e., they suffer from an inability to prevent false-lock conditions.

SUMMARY

A DLL comprises detection circuitry configured to detect a too_slow and a too_fast operating state and correction circuitry configured to correct operation of the DLL when a too_fast or too_slow state is detected.

In one aspect, the correction circuitry can be configured to swallow a pulse of the input clock signal when a too_fast condition is detected.

In another aspect, the correction circuitry can be configured to force the DLL into a too_fast operation state, when a too_slow operation state is detected. The correction circuitry can then be configured to swallow a pulse of the input clock signal once the DLL is in the too_fast operation state.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 3:
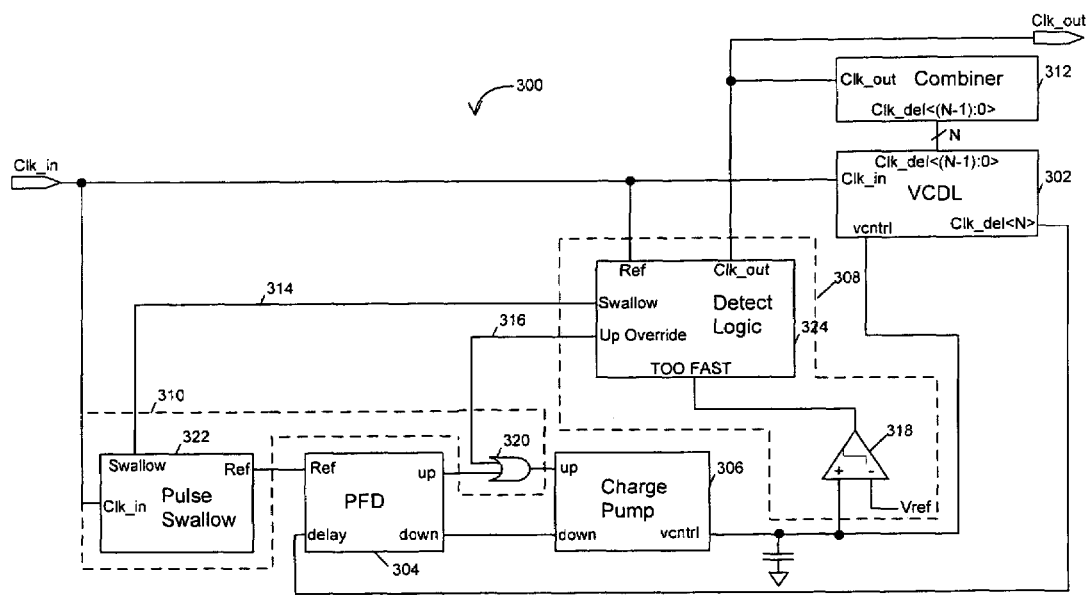
FIG. 3 is a diagram illustrating an example DLL configured in accordance with one embodiment.

FIG. 3 is a diagram illustrating an example DLL circuit 300 configured in accordance of one embodiment of the systems and methods described herein. As with a conventional DLL, such as DLL 200, DLL 300 comprises a VCDL 302 configured to receive an input clock signal (clk_in) and produce a delayed clock signal (clk_delay). DLL 300 also comprises a PFD 304 configured to generate up and down commands that are then provided to a charge pump 306, which is configured to produce a control voltage (v_cntrl) that can be used to control the delays of VCDL 302.

DLL 300 also comprises a combiner 312, which is configured to take the outputs from various taps included in VCDL 302 and combine them in a manner designed to generate the output clock signal (clk_out) that is required. Thus, the output from VCDL 302 to combiner 312 can actually comprise several tap outputs as required by a particular embodiment. A "tap" is the output following a delay block, such as delay block 203 or 210.

In addition, DLL 300 comprises detection circuitry 308, configured to detect a too_fast and/or a too_slow operating state for DLL 300, and correction circuitry 310, configured to correct the operation of DLL 300 when a too_fast or a too_slow operating state is detected.

Figure 1:
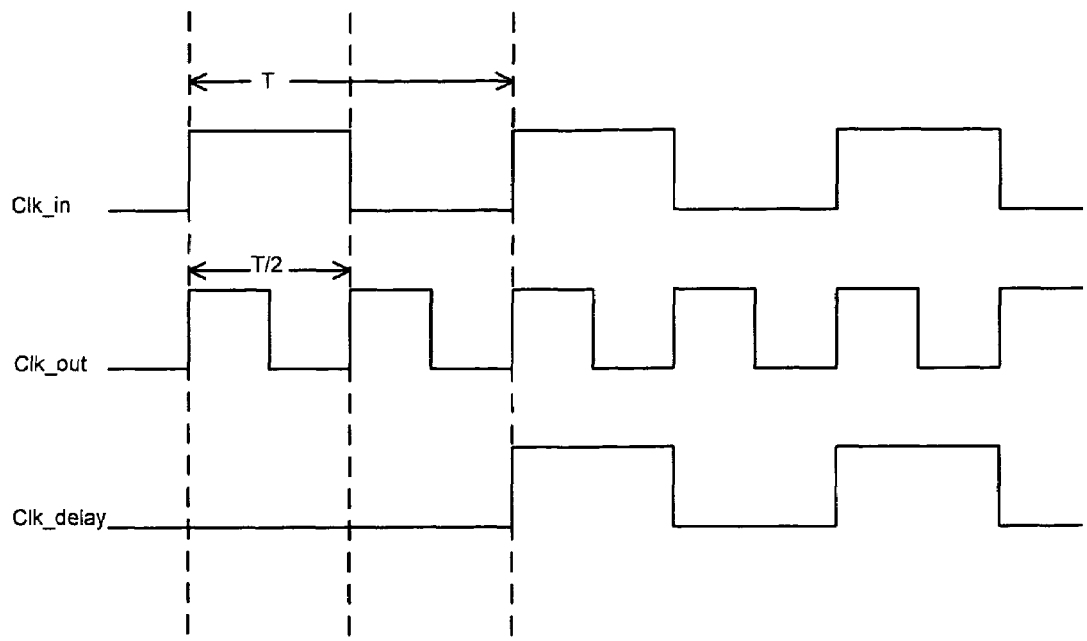
FIG. 1 is a timing diagram illustrating the relative timing for various signals in an exemplary DLL.
Figure 2:
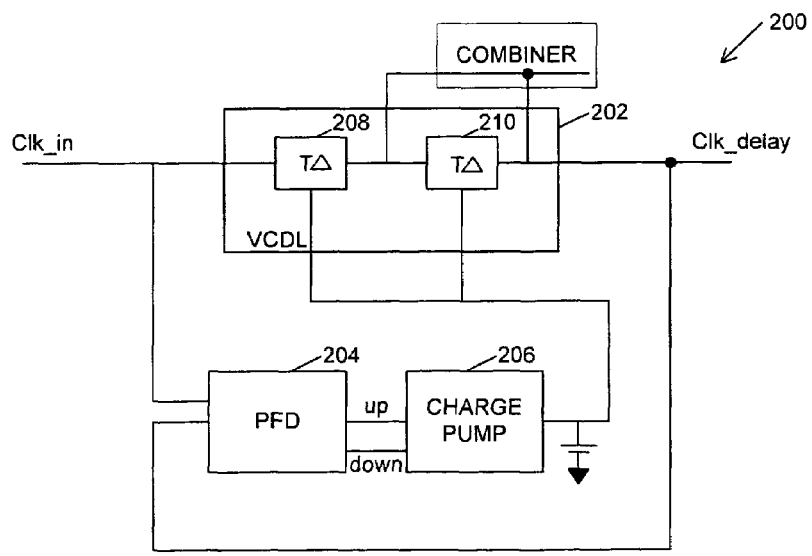
FIG. 2 is a diagram illustrating an exemplary DLL.
Figure 4:
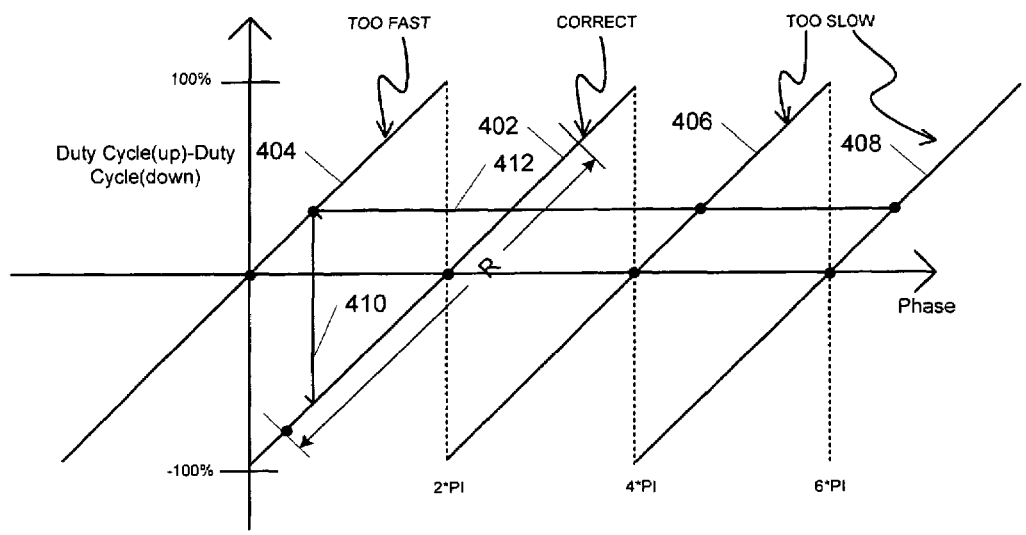
FIG. 4 is a diagram illustrating an example transfer function for a Phase-Frequency Detector that can be included in the DLL of FIG. 3.

FIG. 4 is a graph illustrating the transfer function for PFD 304. The graph of FIG. 4 plots the phase for the delayed clock signal versus the duty cycle for the up down commands output from PFD 304. If the phase of the delayed clock signal fall somewhere along trace 402, then DLL 300 is operating in the correct state and the phase of the delayed clock signal is correct relative to the phase of the input clock signal. Although, the phase of the delayed clock signal may not be precisely aligned with the phase of the input clock signal. If the phase of the delayed clock signal is not precisely aligned with the phase of the input clock signal, then the phase of the delayed clock signal will reside somewhere along trace 402 that is either above or below the x-axis.

For example, the phase of the delayed clock signal can actually be somewhere in the range (R) along trace 402. When this occurs, PFD 304 will detect that the phase of the delayed clock signal is not precisely aligned with the phase of the input clock signal and will issue up and/or down command in order to align the phase of the delayed clock signal precisely with the phase of the input clock signal. This will force the phase of the delayed clock signal to reside at the intersection of trace 402 in the x-axis.

The process of correcting for a slightly misaligned phase of the delayed clock signal, as just described, is the normal operation of DLL 300. In addition, however, DLL 300 can also detect, and correct, when DLL 300 is operating in a too_slow state and/or a too_fast state. It should be noted that the systems and methods described below for correcting a too_slow or too_fast state are not necessarily dependent on any particular systems or methods for detecting a too_slow or too_fast state. Thus, it will be understood that while certain systems and methods for detecting a too_slow or too_fast state are described below in conjunction with particular embodiments of systems and methods for correcting a too_slow or too_fast state once detected, the systems and methods for correcting a too_slow or too_fast state can be combined with other methods for detecting such states.

Figure 5:
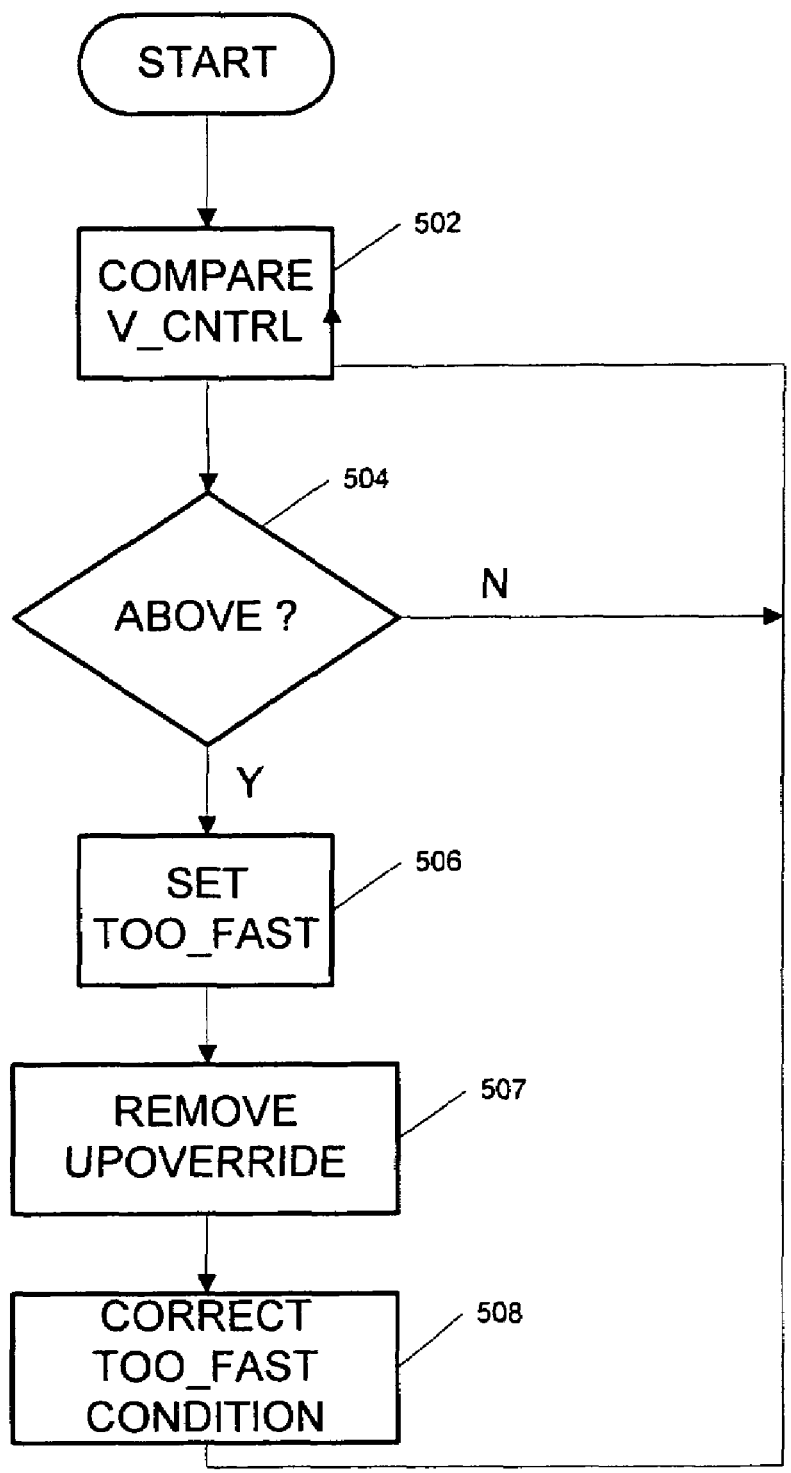
FIG. 5 is a flow chart illustrating an example method for detecting a too_fast state in the DLL of FIG. 3 in accordance with one embodiment.

FIG. 5 is a flowchart illustrating an example method for how detection circuitry 308 can use comparator 318 in order to detect a too_fast operating state for DLL 300 in accordance with one embodiment of the systems and methods described herein. First, in step 502, the control voltage (v_cntrl) produced by charge pump 306 is compared to a threshold, such as a reference voltage (Vref). This reference voltage (Vref) can be within several hundred millivolts of the power supply voltage used by DLL 300. Thus, comparator 318 can be configured to determine whether or not the voltage control signal (v_cntrl) is near the power supply for DLL 300 in step 502.

As will be understood, if the phase for the delayed clock signal is too fast it will reside on trace 404 of the transfer function for PFD 304. When the phase is along trace 404, PFD 304 will attempt to align the phase, via up/down commands, such that it is centered on the x-axis; however, as will be understood, PFD 304 will never be able to force the phase of the delayed clock signal to be centered on the x-axis and thus, will continue to issue up/down commands until the control voltage (v_cntrl) is near, or even reaches the supply voltage level. It will be understood that during normal operation, the control voltage (v_cntrl) will not come close to the supply voltage. Thus, by comparing the control voltage (v_cntrl) to a reference voltage (Vref) that is near the supply voltage level, detection circuitry 308 can determine whether or not DLL 300 is operating in a too_fast state.

Accordingly if it is determined in step 504 that the control voltage (v_cntrl) is above the threshold, or reference voltage (Vref), then detection circuitry 308 can be configured to set a too_fast indicator in step 506, an up_override command in step 507, and correction circuitry 310 can take over in step 508 in order to correct for this too_fast state.

It should be noted that there is only one too_fast state for DLL 300. Thus, once it is detected that DLL 300 is operating in the too-fast state (step 504 and 506), then correction circuitry can correct this condition by simply swallowing one pulse of the input clock signal. Thus, detection circuitry 308 can activate a swallow output 314 in step 506, which can be received by correction circuitry 310. Correction circuitry 310 can be configured to then swallow one pulse of the input clock signal, which causes transition 410 to occur as illustrated in FIG. 4. Once transition 410 has occurred, DLL 300 is back in the correct state and the normal up/down operation of DLL 300 can then take over and cause the phase of the delayed clock signal to be centered on the x-axis as described above. An example implementation of correction circuitry 310 is described in more detail below in relation to FIG. 8.

Figure 6:
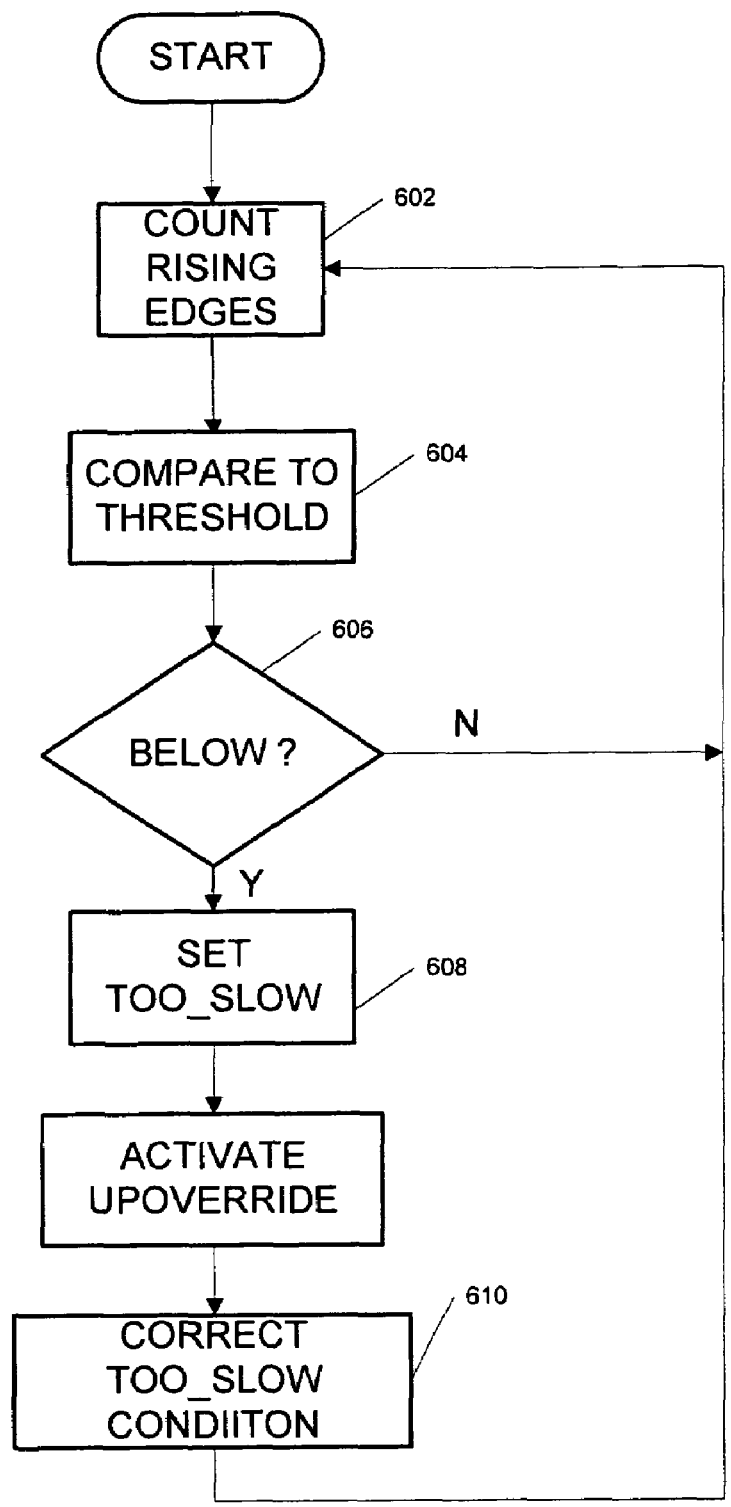
FIG. 6 is a flow chart illustrating an example method for detecting a too_slow state in the DLL of FIG. 3 in accordance with one embodiment.

FIG. 6 is a diagram illustrating an example method of detecting when DLL 300 is operating in a too_slow state in accordance with one embodiment of the systems and methods described herein. In step 602, detection circuitry 308 can be configured to count the number of rising edges on the output clock signal (clk_out). The number of rising edges can then be compared to a threshold in step 604 and if it is determined, in step 606, that the number of rising edges is below the threshold, i.e., there are not enough rising edges in the output clock signal, then detection circuitry can indicate a too_slow state in step 608 and activate an up_override signal in step 609. Correction circuitry 310 can be configured to then take over and correct for the too_slow state in step 610. In other words, if the output clock signal is supposed to be operating at five times the speed of the input clock signal, then for every rising edge of the input clock signal there should be five rising edges of the output clock signal. Thus, if there is only, e.g., four rising edges in the output clock signal for each rising edge of the input clock signal, then detection circuitry can detect that DLL 300 is operating in a too_slow state.

It should be noted, that in the embodiment of FIG. 3, detection circuitry 308 is not configured to detect the correct operating condition. Rather, the correct operating condition is assumed in the absence of the other two operating conditions. It would be understood, however, that in other embodiments detection circuitry 308 can be configured to also detect the correct operating condition.

Figure 7:
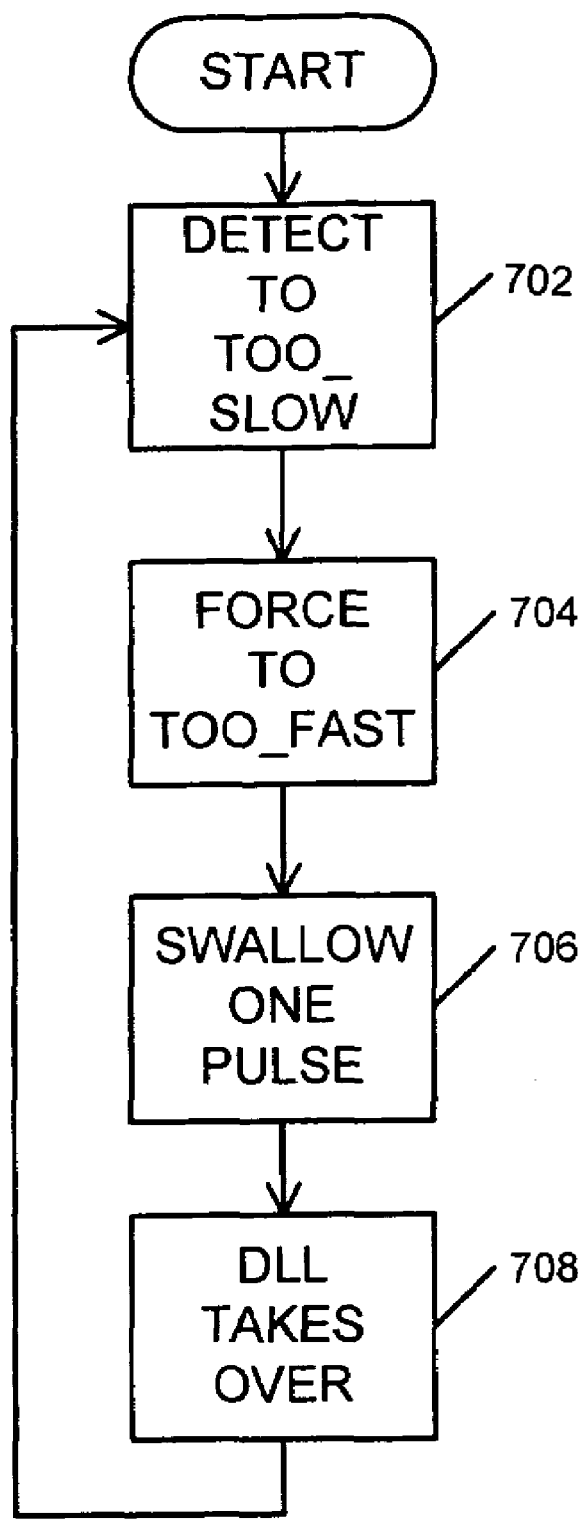
FIG. 7 is a diagram illustrating an example embodiment for correcting a too_slow state in the DLL of FIG. 3 in accordance with one embodiment.

FIG. 7 is a diagram illustrating an example method for correcting the too_slow operating condition in DLL 300 in accordance with one embodiment of the systems and methods described herein. In step 702 the too_slow state can be detected, i.e., in accordance with the process described in relation to FIG. 6. Once the too_slow state is detected, correction circuitry 310 can be configured to force DLL 300 into a too_fast state. This will cause detection circuitry to detect the too_fast state and indicate the too_fast state, e.g., in accordance with the method of FIG. 5. This will cause correction circuitry 310 to swallow a pulse in order to get DLL 300 back into the correct state at which point normal operation can take over to center the phase of the delayed clock signal.

Thus, detection circuitry 310 does not need to detect which too-slow state DLL 300 is operating in. Rather, the method of FIG. 7 takes advantage of the fact that there is only one too_fast state. Thus, when detection circuit 308 detects the too_slow state, it simply forces the operation of DLL 300 into the too-fast state, which can then be corrected by swallowing one pulse of the input clock signal. For example, in one embodiment, correction circuitry 310 can include an OR gate 320. When detection logic 324 detects that DLL 300 is in a too-slow state, it can simply override the commands from PFD 304 by activating an up_override signal 314, which can cause the voltage on charge pump 306 to increase, which will decrease the delay applied by the delay blocks of VCDL 302, until DLL 300 is in a too_fast state. The too_fast state can then be detected by detection logic 324 in conjunction with comparator 318, which can then cause detection logic 308 to turn off up_override signal 316 and activate the swallow signal 314.

Figure 8:
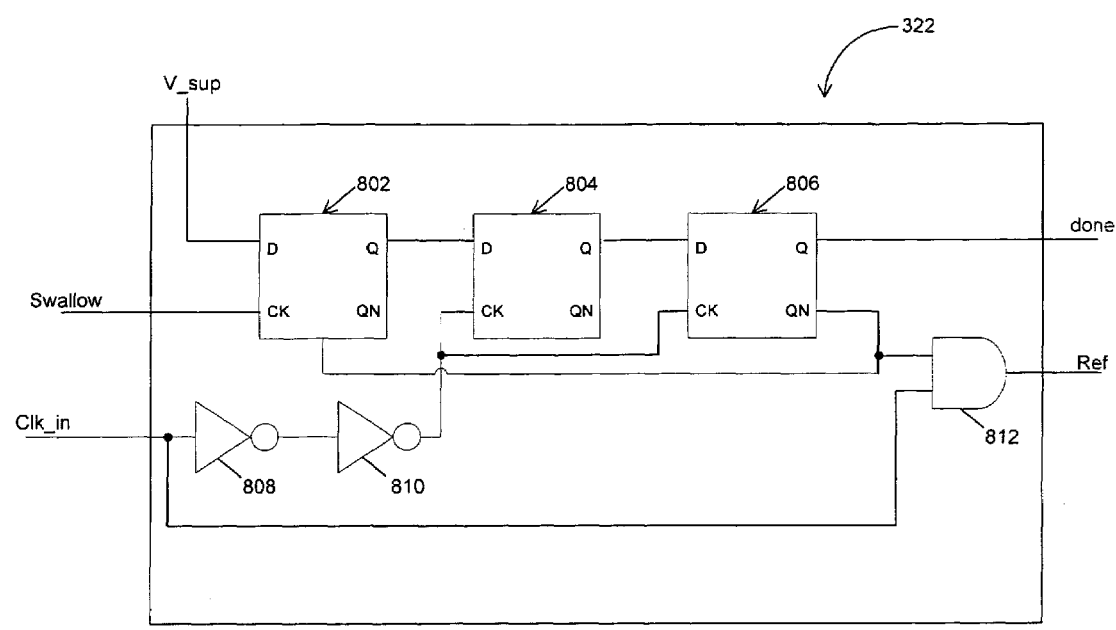
FIG. 8 is a diagram illustrating an example correction circuit that can be included in the DLL of FIG. 3 configured in accordance with one embodiment.

FIG. 8 is a diagram illustrating an example embodiment of a pulse swallower 322 configured in accordance with one embodiment of the systems and methods described herein. As can be seen, pulse swallower 322 comprises three D flip-flops 802, 804, and 806, two inverters 808 and 810, and an and gate 812. The swallow indication from detection circuitry 308 can be received and input to the clock input of D flip-flop 802 as illustrated. The D input of the flip-flop 802 can be pulled up to the supply voltage. Thus, when the swallow input is activated it will cause the output of D flip-flop 802 to transition which can then be fed to the input of the next D flip-flop 804. The input clock signal can be received by inverters 808 and 810 and fed to the clock input of D flip-flops 804 and 806 as illustrated. Thus, once the swallow input is activated the transition on the output of D flip-flop 802 will be propagated through D flip-flops 804 and 806 on successive rising edges of the input clock signal.

The inverse output (QN) of the last D flip-flop 806 can then be fed to and gate 812. The other input of end gate 812 can receive the input clock signal. The output of and gate 312 can then be fed to PFD 304 as indicated.

Figure 9:
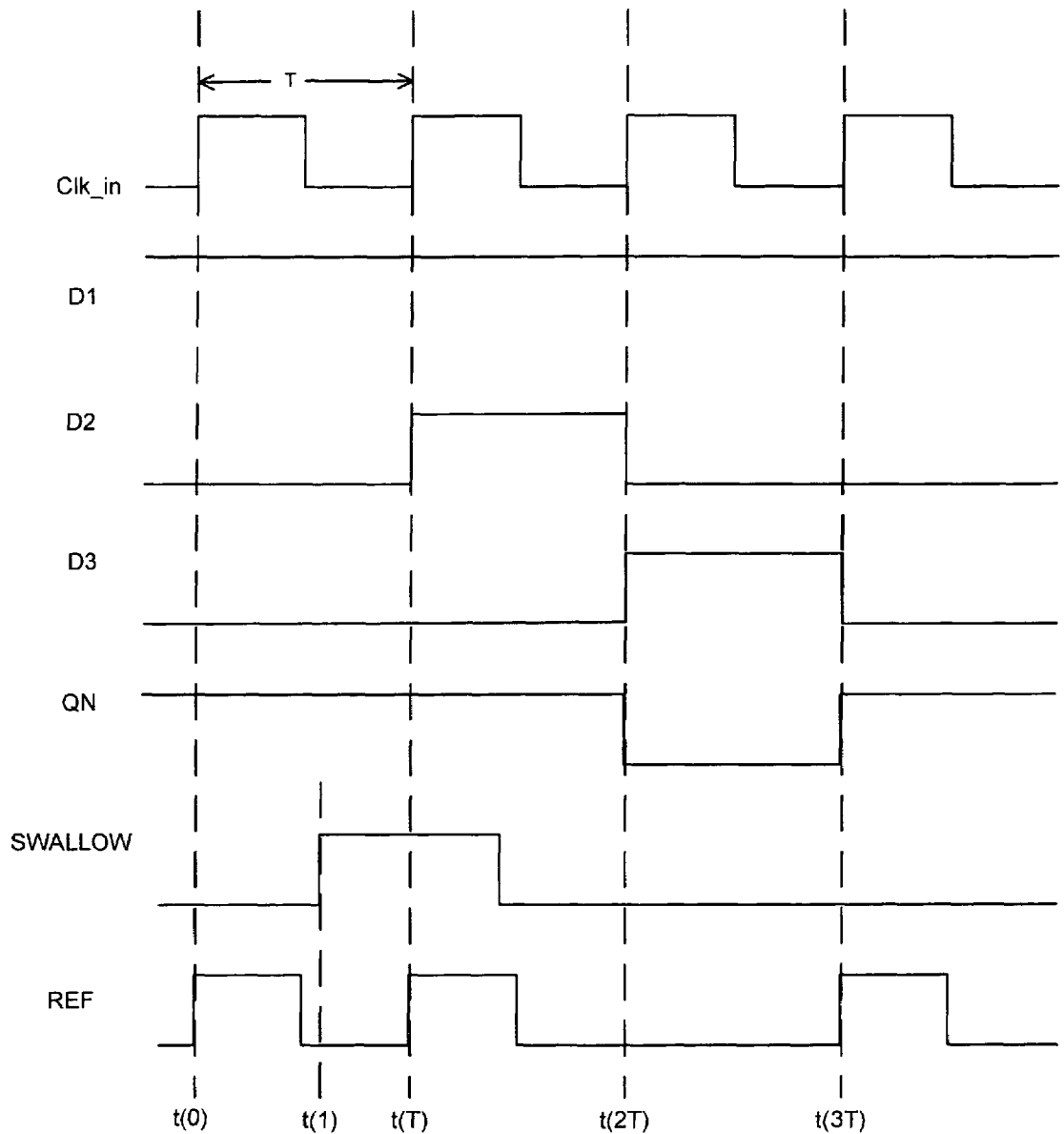
FIG. 9 is a timing diagram illustrating the relative timing for various signals in the correction circuit of FIG. 8.

The operation of the circuit illustrated on FIG. 8 can be explained in relation to the waveforms of FIG. 9. At the top of FIG. 9 is the input clock signal which has a period (T). The signal at the input of D flip-flop 802 ($D_1$) is always high because it is interfaced with the supply voltage; however, it is assumed that D flip-flop 802 has been reset and thus, the output of D flip-flop 802, or the input of D flip-flop 804 ($D_2$) is low as is the input to D flip-flop 806 ($D_3$). The QN output of D flip-flop 806 will be high and, therefore, the reference output will simply track the input clock until the swallow input is activated at time $t_1$.

When the swallow input is activated at time ($t_1$), it will cause the high signal on input $D_1$ to propagate to input $D_2$ on the next rising edge of the input clock at time t(T). This will cause input $D_3$ to transition high on the following rising edge of the input clock at time t(2 T) which will cause the QN output of D flip-flop 806 to transition low. The transition of the QN output of D flip-flop 806 causes the output of and gate 812 to stay low and thus, the reference signal will skip a pulse between the rising edge of the input clock signal at t(2 T) and the rising edge of the input clock signal at t(3 T). The QN output of D flip-flop 806 can be fed back to the reset input of D flip-flop 802 so that signal D2 is forced back to zero at time t(2 T). This will cause the $D_3$ input to transition back to a low on the subsequent rising edge of the input clock, which will cause the QN output of D flip-flop 806 to transition high. At this point, the reference signal will again track the input clock signal as illustrated. Thus, as can be seen, the operation of circuit 322 causes one pulse in the reference output to be swallowed when the swallow input is activated, e.g., by detection circuitry 308.

Detection circuitry 308 and correction circuitry 310 can be implemented relatively efficiently and without any significant overhead in terms of area or cost. As a result, there is no need to include additional VCOs or delay stages for lock detection as in conventional solutions. As will be understood, such additional VCOs or delay stages can increase both the cost and area of the DLL implementation. Further, unlike conventional solutions that simply override the up and down commands generated from the PFD, the systems and methods described herein provide a much more robust solution that ensures the DLL will always lock correctly. Moreover, the systems and methods described herein do not rely on strict control of process parameters designed to prevent excessive delays of more or less than an input clock. As a result, the systems and methods described herein can be implemented in less area and for less cost and still provide superior lock detection.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A delay lock loop, comprising:
   a voltage control delay line configured to receive an input clock signal and to generation a delayed clock signal;
   a detection circuit configured to detect when the delay locked loop circuit is operating in a too_fast or too_slow operating state; and
   a correction circuit coupled with the detection circuit, the correction circuit configured to cause one pulse of the input clock signal to be swallowed when the detection circuitry detects a too_fast operating state, and to force the DLL into a too_fast state when the detection circuit detects a too_slow operating state.

2. The delay lock loop of claim 1, further comprising a phase-frequency detector coupled with the correction circuitry, the phase-frequency detector configured to compare the reference clock signal with the delayed clock signal and to generate up and down commands based on the comparison, and a charge pump coupled with an output from the phase-frequency detector and an output from the correction circuit, the charge pump configured to receive the up and down commands and generate a control voltage in response thereto.

3. The delay lock loop of claim 1, wherein the detection circuitry is configured to detect a too_fast operating state after the correction circuitry has forced the DLL into a too_fast state, and wherein the correction circuit is further configured to cause one pulse of the input clock signal to be swallowed when the detection circuitry detects a too_fast operating state after the correction circuitry has forced the DLL into a too_fast state.

4. The delay lock loop of claim 1, wherein the detection circuit is configured to activate a swallow signal when a too_fast state is detected and to provide the swallow signal to the correction circuitry.

5. The delay lock loop of claim 4, wherein the correction circuitry is configured to generate a reference signal from the input clock signal, and wherein the reference clock signal tracks the input clock signal unless the swallow signal is active.

6. The delay lock loop of claim 2, wherein the charge pump is also coupled with the detection circuitry, and wherein the detection circuitry further comprises a comparator configured to compare the control voltage to a reference voltage in order to detect a too_fast operating state.

7. The delay lock loop of claim 1, wherein the voltage control delay line is further configured to generate a plurality of output tap signals, and wherein the delay lock loop further comprises a combiner coupled with the voltage controlled delayed line, the combiner configured to combine the plurality of output tap signals to generate an output clock signal.

8. The delay lock loop of claim 7, wherein the detection circuit is coupled with the combiner, and wherein the detection circuit is configured to count edges in the output clock signal and compare the number of edges counted to the number of edges in the input clock signal in order to detect a too_slow state.

9. The delay lock loop of claim 2, wherein the detection circuitry is further configured to activate an up_override signal when a too_slow state is detected and provide the up_override signal to the correction circuitry, and wherein the correction circuitry is configured to cause the up and down commands form the phase-frequency detector to be overridden when the up_override signal is active.

10. A method for correcting a too_fast operating state in a delay lock loop, comprising:
    detecting that the delay lock loop is operating in a too_slow state;
    forcing the delay lock loop into a too_fast_state when it is detected that the delay loop is operating in a too_slow state;
    comparing a control voltage to a reference voltage;
    causing a swallow signal to go active based on the comparison; and
    causing a pulse in an input clock signal to be swallowed in response to the swallow signal being active.

11. The method of claim 10, further comprising causing the swallow signal to go active when the control voltage exceeds the reference voltage.

12. A method for correcting a too_slow operating state in a delay lock loop, comprising:
    counting the number of edges in an output clock signal;
    counting the number of edges in an input clock signal;
    comparing the number of edges in the output clock signal to the number of edges in the input clock signal; and
    forcing the delay lock loop into a too_fast operating state based on the comparison.

13. The method of claim 12, further comprising:
    comparing a control voltage to a reference voltage;
    causing a swallow signal to go active based on the comparison; and
    causing a pulse in an input clock signal to be swallowed in response to the swallow signal being active.

14. The method of claim 13, further comprising causing the swallow signal to go active when the control voltage exceeds the reference voltage.

15. A delay lock loop, comprising:
    a means for counting the number of edges in an output clock signal;
    a means for counting the number of edges in an input clock signal;
    a means for comparing the number of edges in the output clock signal to the number of edges in the input clock signal; and
    a means for forcing the delay lock loop into a too_fast operating state based on the comparison.

16. The delay lock loop of claim 15, further comprising:
    a means for comparing a control voltage to a reference voltage;
    a means for causing a swallow signal to go active based on the comparison; and
    a means for causing a pulse in an input clock signal to be swallowed in response to the swallow signal being active.

17. The delay lock loop of claim 16, further comprising a means for causing the swallow signal to go active when the control voltage exceeds the reference voltage.

* * * * *